(12) United States Patent
Smith et al.

(10) Patent No.: US 9,589,965 B1
(45) Date of Patent: Mar. 7, 2017

(54) CONTROLLING EPITAXIAL GROWTH OVER EDRAM DEEP TRENCH AND EDRAM SO FORMED

(71) Applicant: GLOBALFOUNDRIES INC., Grand Cayman (KY)

(72) Inventors: Melissa A. Smith, Somerville, MA (US); Sunit S. Mahajan, Halfmoon, NY (US); Herbert L. Ho, New Windsor, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/004,216

(22) Filed: Jan. 22, 2016

(51) Int. Cl.
*H01L 27/108* (2006.01)

(52) U.S. Cl.
CPC .... *H01L 27/1087* (2013.01); *H01L 27/10826* (2013.01); *H01L 27/10832* (2013.01); *H01L 27/10879* (2013.01)

(58) Field of Classification Search
CPC ........... H01L 27/1087; H01L 27/10832; H01L 27/10879; H01L 27/10826
See application file for complete search history.

(56) References Cited

U.S. PATENT DOCUMENTS

| | | | | |
|---|---|---|---|---|
| 6,680,229 B2* | 1/2004 | Nuttall | ............. | H01L 21/02532 438/256 |
| 7,544,994 B2* | 6/2009 | Schepis | ................. | H01L 21/845 257/302 |
| 7,842,559 B2* | 11/2010 | Jakschik | ................. | H01L 21/84 438/150 |
| 8,441,072 B2* | 5/2013 | Tsai | ................... | H01L 29/66795 257/347 |
| 9,054,194 B2* | 6/2015 | Tung | ................. | H01L 29/41791 |
| 2016/0005607 A1* | 1/2016 | Russell | ............. | C23C 16/45536 438/563 |
| 2016/0104776 A1* | 4/2016 | Ching | ................. | H01L 29/1083 257/401 |

* cited by examiner

*Primary Examiner* — William Coleman
(74) *Attorney, Agent, or Firm* — Yuanmin Cai; Hoffman Warnick, LLC

(57) ABSTRACT

Methods of forming polysilicon-filled deep trenches for an eDRAM are provided. The method may include forming a plurality of polysilicon-filled deep trenches in a substrate. An epitaxy-retarding dopant is introduced to an upper portion of the trenches. A plurality of fins are then formed over the substrate, with each polysilicon-filled deep trench including a corresponding fin extending thereover. A silicon layer is epitaxially grown over at least the polysilicon-filled deep trench. The dopant in the polysilicon-filled deep trenches acts to control the epitaxial growth of the silicon layer, diminishing or preventing shorts to adjacent fins and/or deep trenches at advanced technology nodes.

20 Claims, 3 Drawing Sheets

CONTROLLING EPITAXIAL GROWTH OVER EDRAM DEEP TRENCH AND EDRAM SO FORMED

BACKGROUND

Technical Field

The present disclosure relates to integrated circuit fabrication, and more specifically, to methods of controlling epitaxial growth over polysilicon-filled deep trenches for embedded dynamic random access memory (eDRAM), and the eDRAM so formed.

Related Art

Integrated circuit (IC) technology's continued advance toward ever smaller conductive line widths continually poses challenges. One current technology employs "14 nanometer" line widths (the widths are different for different structures; for instance, the fins are about 10 nm wide, and the gates, 20 nm) on semiconductor-on-insulator substrates. One structure in this technology that currently poses challenges during IC formation includes embedded dynamic random-access memory (eDRAM). In particular, each eDRAM includes a polysilicon-filled deep trench capacitor coupled to a respective finFET transistor. The polysilicon-filled deep trenches are formed in the substrate, and the transistors are formed above and also laterally adjacent to the deep trenches. As understood, each deep trench acts as a capacitor that provides a memory cell under control of the transistor coupled thereto.

Referring to FIGS. 1 and 2, partial formation of an example eDRAM 8 is illustrated in a plan view and a cross-sectional view, respectively. As shown in FIG. 1, transistors 10 are formed as fin type field effect transistors (finFETS), and thus include thin, closely spaced, semiconductor strips or "fins" 12 upon which gate conductors 14 are formed. Source/drain regions (not numbered) of transistors 10 are formed at ends of n-type transistor fin 12 as is polysilicon-filled deep trench capacitor 20. Deep trench capacitors 20 extend into the page in FIG. 1. As shown in FIG. 2, a drain region 22 of transistor 10 typically couples to polysilicon-filled deep trench capacitor 20 therebelow. During fabrication of the finFETS, as shown in FIG. 2, a thin layer of epitaxial silicon 24 is grown in drain region 22 over polysilicon-filled deep trench 20. As illustrated in FIG. 2, polysilicon-filled deep trench 20 may be recessed slightly prior to the epitaxy process. A challenge with formation of the eDRAM arises in that the growth or nucleation of epitaxial silicon 24 over the polysilicon of deep trench 20 can be more rapid and random than over just single-crystalline silicon (see random shape of epi silicon 24 in FIG. 1). In this situation, because fins 12 of transistors 10 are so closely spaced, epitaxial silicon 24 growth over polysilicon-filled deep trenches 20 causes deposited epitaxial silicon 24 to short deep trenches 20 and/or adjacent fins 12, i.e., electrically joining adjacent fins and/or trenches together and making the eDRAM inoperable. Potential short regions are shown in phantom ovals in FIGS. 1 and 2. The current situation leads to yield loss during eDRAM formation and limits the development of eDRAM at the 14 nanometer technology node and beyond.

A number of approaches have been proposed to solve the above-identified challenge. In one approach, implanting phosphorous into the fin has been proposed, but this approach adversely impacts device performance. Other proposals include: performing a longer and deeper recess of the drain region, but this has been shown to be ineffective at reducing deep trench shorts and increases strap resistance; performing an etch back of the polysilicon, but this requires additional masks after trench formation and several additional process steps; providing an oxide plug which increases strap resistance and negatively impacts device performance; and providing a deep trench collar, which also tends to increase resistance and slows read/write speeds for the eDRAM.

SUMMARY

A first aspect of the disclosure is directed to a method comprising: forming a plurality of polysilicon-filled deep trenches in a substrate; introducing an epitaxy-retarding dopant to an upper portion of the plurality of polysilicon-filled deep trenches; forming a plurality of fins over the substrate, each polysilicon-filled deep trench connecting to a corresponding fin extending thereover; and epitaxially growing a silicon layer over at least the polysilicon-filled deep trench.

A second aspect of the disclosure includes an embedded dynamic random-access memory (eDRAM), comprising: a substrate; a polysilicon-filled deep trench in the substrate, the polysilicon-filled deep trench including a doped upper portion including an epitaxy-retarding dopant; and a fin-type field effect transistor (finFET) extending over the polysilicon-filled deep trench, the finFET including an epitaxial silicon layer extending over the doped upper portion of the polysilicon-filled deep trench, the epitaxial silicon layer having a periphery substantially identical to a periphery of the doped upper portion of the polysilicon-filled deep trench.

A third aspect of the disclosure related to a method comprising: forming a plurality of polysilicon-filled deep trenches in a substrate by: patterning a mask over the substrate, the mask having a pattern of a plurality of trench openings, transferring the pattern of the plurality of openings into the substrate by etching to form a plurality of deep trenches, and filling polysilicon in each deep trench to form the plurality of polysilicon-filled deep trenches; implanting an epitaxy-retarding, n-type dopant into the plurality of polysilicon-filled deep trenches using the mask in-place; annealing to drive in the epitaxy-retarding, n-type dopant into the plurality of polysilicon-filed deep trenches; removing the mask; forming a plurality of fins over the substrate, each polysilicon-filled deep trench connecting to a corresponding fin extending thereover; and epitaxially growing a silicon layer over at least the polysilicon-filled deep trench.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
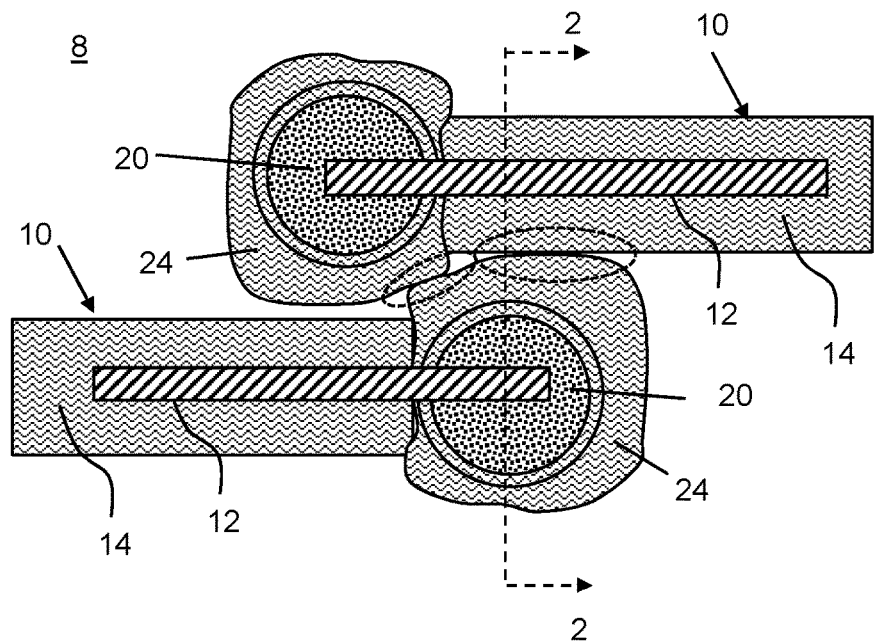
FIG. 1 shows a plan view of conventional polysilicon-filled deep trenches of an embedded dynamic random access memory (eDRAM).
Figure 2:
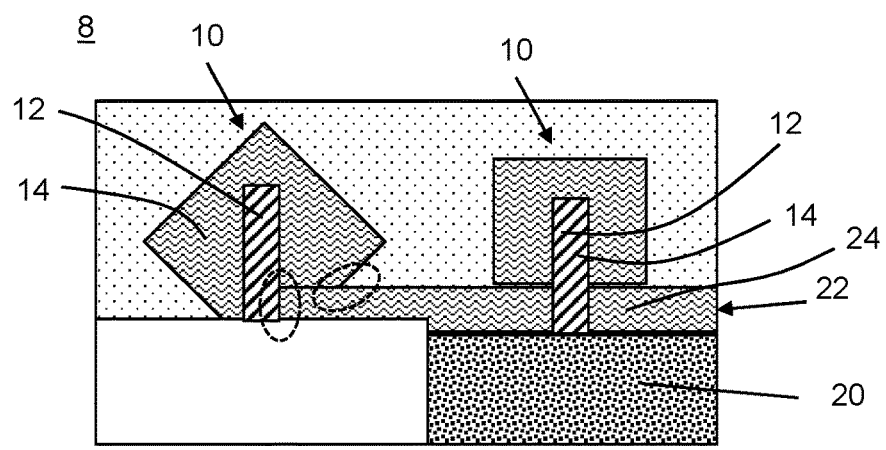
FIG. 2 shows a cross-sectional view along line 2-2 in FIG. 1.

The drawings are not to scale. In the drawings, like numbering represents like features between and among the drawings.

DETAILED DESCRIPTION

Referring to the drawings, methods of forming polysilicon-filled deep trenches and controlling epitaxial growth thereover according to embodiments of the disclosure are provided. Embodiments of the disclosure provide a method of forming polysilicon-deep trenches for eDRAM with a doped upper portion (surface) that controls epitaxial growth and avoids shorting to adjacent fins and/or trenches at advanced technology nodes such as but not limited to the 14 nanometer node.

Figure 3:
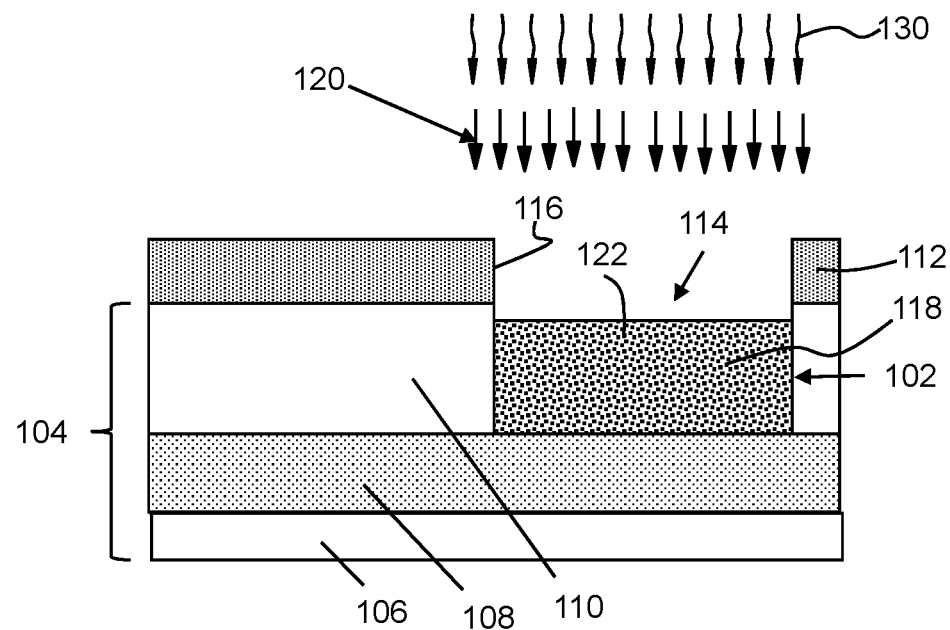
FIGS. 3 and 4 show a cross-sectional views of a method of forming polysilicon-filled deep trenches for an eDRAM according to embodiments of the disclosure.

FIG. 3 shows a cross-sectional view a number of steps of a method according to embodiments of the disclosure. More specifically, FIG. 3 shows forming a plurality of polysilicon-filled deep trenches 102 (one shown in FIG. 3, see FIG. 4) in a substrate 104. Substrate 104 is shown herein as a semiconductor-on-insulator (SOI) substrate including a bulk semiconductor layer 106, an insulator layer 108 and semiconductor-on-insulator (SOI) layer 110. (The layers are not shown to scale.) It is emphasized that the teachings of the invention are not limited to SOI technology and can be applied to any substrate, e.g., a bulk semiconductor substrate. Bulk semiconductor layer 106 and/or SOI layer 110 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, SOI layer 110 and/or bulk semiconductor layer 106 may be strained.

Insulator layer 108 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), a spin-on silicon-carbon containing polymer material available from JSR Corporation, other low dielectric constant (<3.9) material, or layers thereof. Substrate 104 may be formed using any now known or later developed technique such as deposition, or wafer bonding.

Polysilicon-filled trenches 102 may be formed in a number of ways. In one embodiment, substrate 104 is shown having a mask 112 formed thereon for forming deep trenches 114 (only one shown in FIG. 3). Mask 112 is patterned over substrate 104 to provide a plurality of trench openings 116 therein. Mask 112 may be deposited using any technique appropriate for the material used. As used herein, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, spin-on methods, physical vapor deposition (PVD), atomic layer deposition (ALD), molecular beam epitaxy (MBE), plating, or physical evaporation. Mask 112 may include any now known or later developed mask material appropriate for etching substrate 104 such as but not limited to a silicon nitride mask.

FIG. 3 also shows transferring the pattern of the plurality of openings into substrate 104 (one shown for clarity) by etching using mask 112 to form deep trench 114. "Etching" generally refers to the removal of material from a substrate (or structures formed on the substrate), and is often performed with a mask 112 in place so that material may selectively be removed from certain areas of the substrate, while leaving the material substantially unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. As used herein, "deep trenches" may be to any depth considered deep for the technology node being employed. For example, for the 14 nanometer technology node, deep trenches may have a depth in the range of approximately 2000 nanometers (nm) to approximately 3500 nm. SOI layer 110 may have a thickness ranging from approximately 185 nm to approximately 195 nm. As used herein, "approximately" may indicate +/−10% of the value(s) stated.

Once deep trenches 114 are formed, polysilicon-filled deep trenches 102 may then be formed by filling polysilicon 118 in the deep trenches. Polysilicon may be filled using any technique such as but not limited to the various depositing techniques listed herein.

FIG. 3 also shows introducing an epitaxy-retarding dopant 120 to an upper portion 122 of plurality of polysilicon-filled deep trenches 102, which may also be referred to herein as doped upper portion 122. This process is commonly referred to as "doping", but in any event, includes introducing impurities (dopants) into polysilicon-filled deep trenches 102, or introducing elements onto upper portion (surface) 122 of polysilicon-filled deep trenches 102. Doping is more commonly used to form the source and drain regions of a FET. In one embodiment, dopant 120 may be introduced during forming of upper portion 122, e.g., by introducing epitaxial-retarding dopant 120 during deposition of polysilicon. In another embodiment, an ion implanter may be employed for the implantation of epitaxial-retarding dopant 120 into upper portion 122. In this case, an inert carrier gas such as nitrogen may be used to bring in the impurity source (dopant). In accordance with embodiments of the disclosure, in contrast to conventional processing, epitaxy-retarding dopant 120 is introduced to change the way epitaxial growth occurs on the polysilicon in polysilicon-filled deep trenches 102. In particular, and as will be described further herein, epitaxy-retarding dopant 120 acts to slow the rapidity of epitaxy growth of a semiconductor such as silicon atop polysilicon-filled trenches 102. Epitaxy-retarding dopant 120 may include an n-type dopant, which may include but is not limited to: phosphorous (P) and arsenic (As). As understood, n-type dopants are typically introduced to a semiconductor to generate free electrons (by "donating" electron to semiconductor), but here are used to impact epitaxial growth from polysilicon. In one embodiment, epitaxy-retarding dopant 120 includes phosphorous. In an alternative embodiment, however, epitaxy-retarding dopant 120 may include arsenic. The implanting may occur using any now known or later developed technique, e.g., directional implanting, angled implanting, etc. In one embodiment, for 14 nm technology, implanting may use an ion energy of approximately 10 Kilo-electronVolts (KeV). Further, for the 14 nm technology node, implanting may use a dose of ions ranging from approximately $1\times10^{15}$ to approximately $3\times10^{15}$ atoms per square centimeter. Polysilicon-filled deep trenches 102 may have a doped upper portion 122 of, for example, phosphorous.

In accordance with embodiments of the disclosures, as illustrated in FIG. 3, mask 112 may remain after formation of deep trenches 114 to shield areas outside of polysilicon-filled deep trenches 102 during the introduction of epitaxial-retarding dopant 120, e.g., by implanting using mask 112 in-place. In this fashion, mask 112 may be used to introduce ions, e.g., by implanting, substantially only into plurality of polysilicon-filled deep trenches 102, relative to surrounding areas of the substrate. Where ion implanting is used, mask 112 ideally has material and/or sufficient depth to prevent ions from penetrating through mask 112 into SOI layer 110 adjacent polysilicon-filled deep trenches 102.

FIG. 3 also shows an optional step of annealing 130 after the epitaxial-retarding dopant introduction, which may be desirable to further drive epitaxy-retarding dopant 120 into polysilicon-filled trenches 102, i.e., thickening doped upper portion 122. The annealing may not be necessary in all instances. For example, in some embodiments, only a thin upper portion 122 of polysilicon-filled trenches 102 needs to include epitaxy-retarding dopant 120 in order to slow epitaxy growth.

Figure 4:
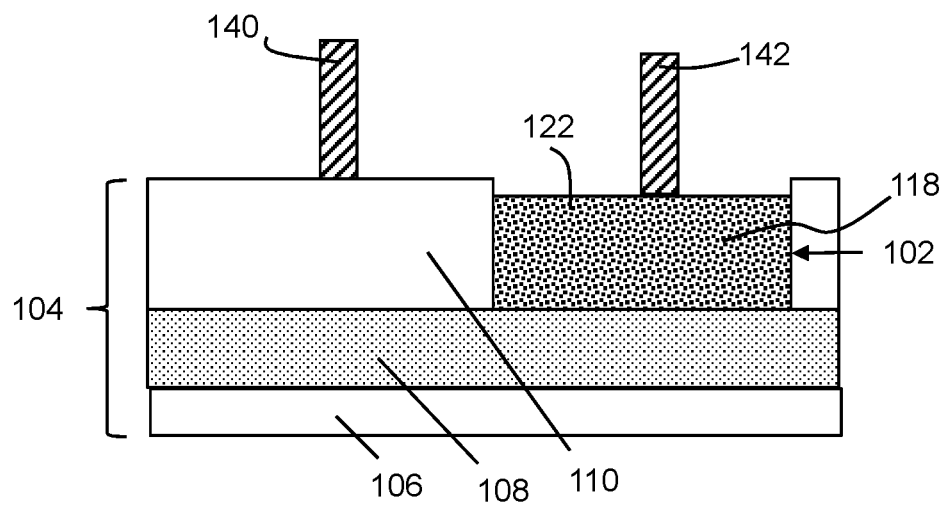

FIG. 4 shows a cross-sectional view illustrating embodiments of the method post-removal of mask 112 (FIG. 3), which may occur using any now known or later developed technique, e.g., an etching such as RIE as described herein. FIG. 4 also shows forming a plurality of fins 140, 142 over substrate 104, which will eventually be part of a fin-type field effect transistor (finFET) 160, 162 (FIG. 6) and an eDRAM 164 (FIG. 6). As illustrated, each polysilicon-filled deep trench 102 connects to a fin 142 extending thereover. It is understood that fin 140, while not shown over a polysilicon-filled trench 102 in the particular cross-sectional view of FIG. 4, actually extends over polysilicon-filled deep trench at a location either into or out of the page—for further clarity, see FIG. 5. Fins 140, 142 may be formed using any now known or later developed technique such as depositing a semiconductor layer over substrate 104, depositing and patterning a mask (not shown) and etching to remove the semiconductor layer between fins 140, 142.

Figure 5:
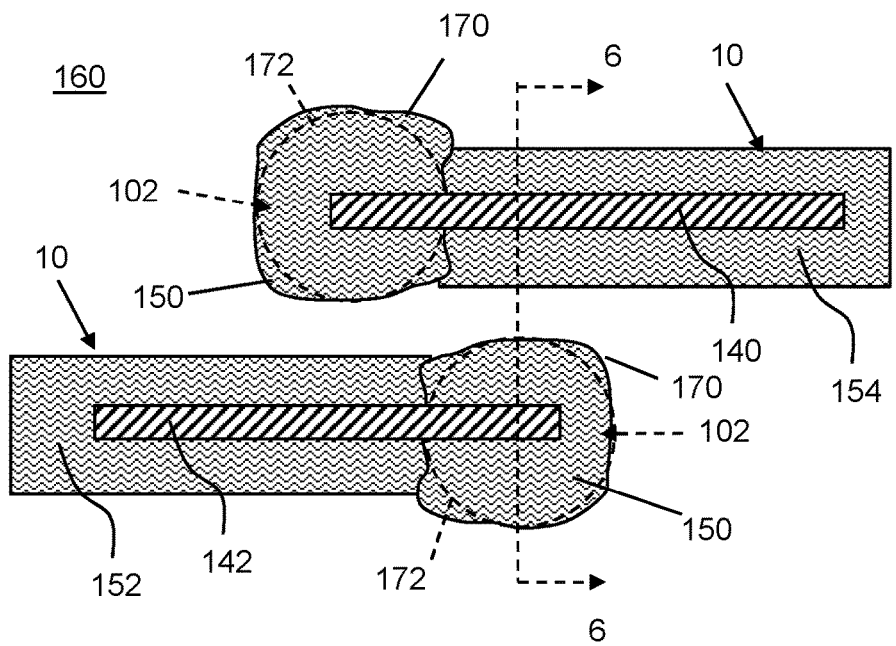
FIG. 5 shows a plan view of polysilicon-filled deep trenches of an eDRAM according to embodiments of the disclosure.
Figure 6:
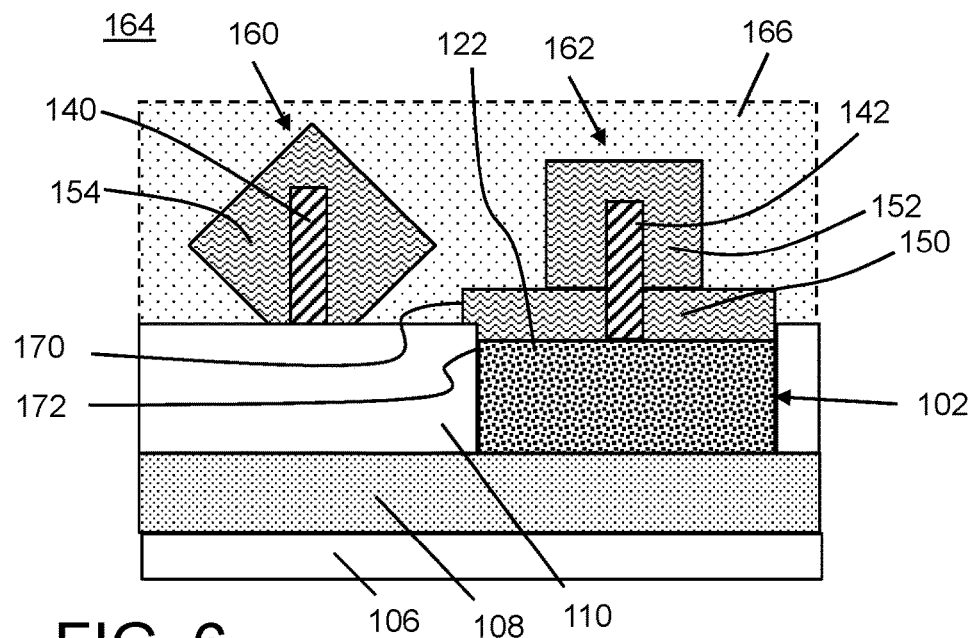
FIG. 6 shows a cross-sectional view along line 6-6 in FIG. 5 of polysilicon-filled deep trenches of an eDRAM according to embodiments of the disclosure.

FIGS. 5 and 6 show epitaxially growing a silicon layer 150 over at least polysilicon-filled deep trench 102. FIG. 5 shows a plan view of epitaxial growth relative to adjacent fins 140, 142 over polysilicon-filled trenches 102, and FIG. 6 shows a cross-sectional view along line 6-6 in FIG. 5. As can be observed by comparing FIG. 5 to FIG. 1 and FIG. 6 to FIG. 2, due to epitaxy-retarding dopant 120 (FIG. 3) in doped upper portion 122 (FIG. 6 only) of polysilicon-filled deep trenches 102, epitaxial growth 150 is slower and more controlled compared to conventional techniques. Consequently, shorts between adjacent polysilicon filled deep trenches 102 and fins 140, 142 are diminished as are shorts between adjacent polysilicon-filled deep trenches 102. Epitaxial growth, however, over fins 140, 142 is not impacted. That is, as shown in FIG. 6, epitaxial growth may also form a silicon layer 152 over fin 142, and a silicon layer 154 over fin 140. Epitaxial growth of silicon layer 154 over fin 140 occurs as expected, resulting in the conventional diamond shape growth surrounds fin 140. In contrast, epitaxial growth of silicon layer 150 over polysilicon filled deep trenches 102 is slower and more controlled due to doped upper portion 122, resulting in a more square or linear growth of epitaxial layer 152 on fin 142.

Subsequent processing may include any conventional or later developed steps to create finFETs 160, 162 from fins 140, 142, respectively, and an eDRAM 164, e.g., source/drain doping, gate formation, back-end-of-line interconnect forming, etc. As part of these processes, FIG. 6 shows forming an interlayer dielectric layer 166, which may include any dielectric listed herein for insulator layer 108. eDRAM 164 may include substrate 104 (FIG. 4), and polysilicon-filled deep trench(es) 102 in substrate 104. As understood, each polysilicon-filled deep trench 102 may be in a drain region of finFET 162, and provide a deep trench capacitor controlled by a respective finFET. As noted, each polysilicon-filled deep trench 102 includes doped upper portion 122 including epitaxy-retarding dopant 120 (FIG. 3). eDRAM 164 may also include finFET 160, 162 extending over polysilicon-filled deep trench 102, where each finFET 160, 162 includes epitaxial silicon layer 150 extending over doped upper portion 122 of polysilicon-filled deep trench 102. As shown best in FIG. 5, in contrast to conventional structures, epitaxial silicon layer 150 has a periphery 170 substantially identical to a periphery 172 of doped upper portion 122 of polysilicon-filled deep trench 102, which prevents shorting. As used herein, "substantially identical" indicates periphery 170 does not extend more than approximately 10 nm beyond periphery 172.

Use of epitaxy-retarding dopant 120 (FIG. 3) diminishes or prevents shorts between polysilicon-filled deep trenches 102 in eDRAM 164 and can be readily implemented to existing processes as it uses only one additional dopant-introducing step with no additional masks. The process does not impact epitaxial growth on fins 140, 142.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a plurality of polysilicon-filled deep trenches in a substrate;
   introducing an epitaxy-retarding dopant to an upper portion of the plurality of polysilicon-filled deep trenches;
   forming a plurality of fins over the substrate, each polysilicon-filled deep trench connecting to a corresponding fin extending thereover; and
   epitaxially growing a silicon layer over at least the polysilicon-filled deep trench.

2. The method of claim 1, wherein the epitaxy-retarding dopant includes an n-type dopant.

3. The method of claim 1, wherein the epitaxy-retarding dopant includes phosphorous.

4. The method of claim 1, wherein the epitaxial silicon layer includes a periphery substantially identical to a periphery of the upper portion of the polysilicon-filled deep trench, and wherein the epitaxy-retarding dopant includes arsenic.

5. The method of claim 1, wherein the introducing includes implanting the epitaxial-retarding dopant into the upper portion of the plurality of polysilicon-filled deep trenches, further comprising annealing the plurality of polysilicon-filled deep trenches after the implanting.

6. The method of claim 1, wherein the epitaxially growing the silicon layer includes growing silicon on the corresponding fin connected to and over each polysilicon-filled trench.

7. The method of claim 1, further comprising forming a fin field effect transistor for each of the plurality of polysilicon-filled deep trenches using the corresponding fin connected to and over each of the plurality of polysilicon-filled deep trenches.

8. The method of claim 1, wherein the forming of the plurality of polysilicon-filled deep trenches includes:
   patterning a mask over the substrate to provide a plurality of trench openings;
   etching the plurality of trench openings into the substrate using the mask to form a plurality of deep trenches; and
   filling polysilicon in each deep trench to form the plurality of polysilicon-filled deep trenches.

9. The method of claim 1, wherein the introducing includes implanting the epitaxial-retarding dopant using an ion energy of approximately 10 Kilo-electronVolts (KeV).

10. The method of claim 1, wherein the introducing includes implanting the epitaxial-retarding dopant at a dose of ions ranging from approximately $1\times10^{15}$ to approximately $3\times10^{15}$ atoms per square centimeter.

11. The method of claim 8, wherein the introducing includes using the mask to implant ions of the epitaxial-retarding dopant substantially only in the plurality of polysilicon-filled deep trenches, relative to surrounding areas of the substrate.

12. An embedded dynamic random-access memory (eDRAM), comprising:
   a substrate;
   a polysilicon-filled deep trench in the substrate, the polysilicon-filled deep trench including a doped upper portion including an epitaxy-retarding dopant; and
   a fin-type field effect transistor (finFET) extending over the polysilicon-filled deep trench, the finFET including an epitaxial silicon layer extending over the doped upper portion of the polysilicon-filled deep trench, the epitaxial silicon layer having a periphery substantially identical to a periphery of the doped upper portion of the polysilicon-filled deep trench.

13. The eDRAM of claim 12, wherein the epitaxy-retarding dopant includes an n-type dopant.

14. The eDRAM of claim 12, wherein the epitaxy-retarding dopant includes phosphorous.

15. The eDRAM of claim 12, wherein the epitaxy-retarding dopant includes arsenic.

16. The eDRAM of claim 12, wherein the epitaxial silicon layer surrounds each fin of the finFET extending over a respective polysilicon-filled deep trench.

17. A method comprising:
   forming a plurality of polysilicon-filled deep trenches in a substrate by:
      patterning a mask over the substrate, the mask having a pattern of a plurality of trench openings,
      transferring the pattern of the plurality of openings into the substrate by etching to form a plurality of deep trenches, and
      filling polysilicon in each deep trench to form the plurality of polysilicon-filled deep trenches;
   implanting an epitaxy-retarding, n-type dopant into the plurality of polysilicon-filled deep trenches using the mask in-place;
   annealing to drive in the epitaxy-retarding, n-type dopant into the plurality of polysilicon-filled deep trenches;
   removing the mask;
   forming a plurality of fins over the substrate, each polysilicon-filled deep trench connecting to a corresponding fin extending thereover; and
   epitaxially growing a silicon layer over at least the polysilicon-filled deep trench.

18. The method of claim 17, wherein the epitaxy-retarding n-type dopant is selected from the group consisting of phosphorous and arsenic.

19. The method of claim 17, wherein the implanting includes using an ion energy of approximately 10 Kilo-electronVolts (KeV).

20. The method of claim 17, wherein the implanting includes using a dose of ions ranging from approximately $1\times10^{15}$ to approximately $3\times10^{15}$ atoms per square centimeter.

* * * * *